United States Patent
Han et al.

(10) Patent No.: US 6,624,023 B1
(45) Date of Patent: Sep. 23, 2003

(54) METHOD FOR IMPROVING THE PERFORMANCE OF FLASH MEMORY

(75) Inventors: Tzung-Ting Han, I-Lan (TW); Chun-Lein Su, Tainan (TW); Chin-Ta Su, Yun-Lin (TW)

(73) Assignee: Macronix International Co., Ltd., Hsin-Chu (TW)

( * ) Notice: Subject to any disclaimer, the term of this patent is extended or adjusted under 35 U.S.C. 154(b) by 62 days.

(21) Appl. No.: 10/152,585

(22) Filed: May 23, 2002

(51) Int. Cl.⁷ .............................................. H01L 21/336
(52) U.S. Cl. ....................................... 438/257; 438/954
(58) Field of Search ................................ 438/257, 263, 438/264, 593, 594, 770, 954, 663

(56) References Cited

U.S. PATENT DOCUMENTS 6,191,463 B1 * 2/2001 Mitani et al. ............... 257/411
6,348,380 B1 * 2/2002 Weimer et al. .............. 438/257

* cited by examiner

*Primary Examiner*—David Nhu

(57) ABSTRACT

The method for improving the performance of flash memory. A substrate is proved. A tunnel oxide layer is formed on the substrate. There two gate, structure are formed on the tunnel oxide layer. The gate structure including a first polysilicon layer as a floating gate, an interpoly dielectric layer such as ONO layer on the floating gate, a second polysilicon layer as a control gate on the interpoly dielectric layer. Moreover, the poly stringer is exit between the gates, wherein the poly stringer is unmovied after etched. Next, the oxygen free radical process cell oxidation is processed. The results ONO encroachment is very slightly then improvement of 6% GCR with pre-mixing gas process cell oxidation can increase operation speed by more than 5 times and eliminated poly stringer.

19 Claims, 5 Drawing Sheets

METHOD FOR IMPROVING THE PERFORMANCE OF FLASH MEMORY

BACKGROUND OF THE INVENTION

1. Field of the Invention

The present invention relates generally to fabricating flash memory and in particular the present invention relates to using oxygen free radical process cell oxidation to improving the performance of flash memory.

2. Description of the Prior Art

Nonvolatile memory devices include flash EEPROMs (electrical erasable programmable read only memory devices). FIG. 1 represents the relevant portion of a typical flash memory cell. The memory cell typically includes a substrate 10 and a thin gate dielectric layer 20 (commonly referred to as the tunnel oxide) formed on the surface of the substrate 10, two stacked gate structure 70 overlying the tunnel oxide 20. The stacked gate 70 also includes a first polysilicon layer as a floating gate 30 which overlies the tunnel oxide 20 and an interpoly dielectric layer 40 which overlies the floating gate 30. Lastly, a second polysilicon layer as a control gate 50 overlies the interpoly dielectric layer 40.

As shown in FIG. 1, the stacked gate structure 70 is substantially etched away using conventional etching techniques. However, a problem often occurs at this step involving formation of polystrings 60. Poly stringers 60 result from incomplete removal of polysilicon layer 30 from the unmasked portions of the wafer during etch. These remaining portions of polysilicon layer 30 material are known as polysilicon layer stringers 60 as shown in FIG. 1, which may result in electrically shorting adjacent memory cells. In the other words, the polysilicon layer 30 etching step serves in part to isolate one memory cell from another. However, if a portion of the polysilicon layer 30 is not etched away forms a conductive path (e.g., poly stringer 60) from one memory cell to another, the memory cells will become electrically shorted.

As shown in FIG. 2, the interpoly dielectric layer 40 has a number of important functions including insulating the control gate 50 from the floating gate 30. Accordingly, it is desirable to form a high quality interpoly dielectric layer 40. The interpoly dielectric layer 40 is often a multilayer insulator such as an oxide-nitride-oxide (ONO) layer 40 having two oxide layers 42 and 46 sandwiching a nitride layer 44. The thick of bottom oxide layer 42 is about 43 angstrom and top oxide layer 46 is about 62 angstrom. The thick of nitride layer 44 is about 59 angstrom. If the oxide layer 42, 46 is too thick, the required programming voltage increases undesirably.

As shown in FIG. 3, in conventional cell oxidation method, there are dry oxidation, wet oxidation and dry RTO method. They surrounded the surface of the cell to formed thin oxide layer 80 and thick about 100 angstrom. The object of the thin oxide layer 80 provided an insulation protection of the cell. Moreover, the thick of oxide layer is slight, the poly stringer 65 is still exist. The poly stringer 65 which may result in electrically shorting adjacent memory cells. However, if a portion of the poly stringer 65 is not oxidation away formed a conductive path from one memory cell, the memory cells will become electrically shorted. The result is reduced performance of flash memory cell.

As shown in FIG. 4, but in those oxidation methods, no matter using dry oxidation, wet oxidation or dry RTO method the problem of serious interpoly dielectric layer 40 encroachment (to formed oxide layer) can't on a valid time programming erased of flash memory. In flash memory, the gate coupling ratio (GCR) value will decrease apparently when the thickness of cell oxidation is increased. This is because of the oxidation encroachment issue between inter poly dielectric layer 40 and polysilicon layer 30, 50 interface. As shown in FIG. 4, the interpoly dielectric layer 40 comprised bottom oxide layer 42, nitride layer 44 and top oxide layer 46. When running oxidation process of the cell, serious encroachment issue 42-1,46-1 between bottom oxide layer 42 and first polysilicon layer 30, top oxide layer 46 and second polysilicon layers 50. The result is thick of ONO layer (interpoly dielectric layer) 40 increased, the required programming voltage increases undesirably or reduced operating speed.

The method of cell oxidation by dry oxidation process is grown at 875° C. on furnace. The process condition are temperature about 875° C., oxygen gas flow about 10000 sccm and time about 42 minutes 30 seconds. The result diagram as shown FIG. 4, the thick of cell oxide layer 80 about 100 angstrom, it is found that a serious encroachment after cell oxidation process is observed. The encroachment oxide is grown between ONO layer 40 and first, second polysilicon layers 30, 50 interface. This encroachment issue 42-1,46-1 will increase the thickness of ONO layer 40 and decrease gate coupling ratio. Lower gate coupling ratio will degrade channel erase speed.

The method of cell oxidation by wet oxidation process is grown at 820° C. The process condition are the temperature about 820° C., the oxygen gas flow about 4000 sccm, the hydrogen gas flow about 7200 sccm, time about 7 minutes and 10 minutes by annealing with nitrogen gas 15000 sccm. From this method result, diagram same as FIG. 4, the thick of cell oxide layer 80 is about 70 angstrom. It is found that cell oxidation by wet oxidation is much more serious ONO encroachment issue 42-1, 46-1 than that by dry oxidation. Even if the thickness of wet oxidation only 70 angstrom, the encroachment oxide grown between ONO layer 40 and polysilicon layer 30, 50 interface is very thick.

The method of cell oxidation by dry RTO process is grown at 1100° C. The process condition are temperature about 1100° C., time about 140 seconds. From this method result, the thick of cell oxide layer 80 is about 120 angstrom. It is found that cell oxidation by RTO also has encroachment issue 42-1, 46-1 like dry oxidation, the diagram same as FIG. 4.

In the prior art of cell oxidation method, no matter using dry oxidation, wet oxidation or dry rapid thermal oxidation (RTO) method the serious ONO encroachment to formed. Then the two oxide layer of ONO layer are thicker, the required programming voltage increases undesirably. The result is reduced performance of flash memory.

SUMMARY OF THE INVENTION

In this invention, they will demonstrate a powerful oxidation method to solving ONO encroachment issue by oxygen free radical process. Scaling down the thickness of encroachment oxide of cell oxidation will improve the gate coupling ratio, however, poly stringer and repaired capability of etching damage are other serious after etched. In order to oxidation poly stringer fully, it is necessary to use thicker cell oxidation process.

In accordance with the present invention, it is a main object of this invention to form cell re-oxidation is described which uses an oxygen free radical process.

It is another object of this invention by using oxygen free radical process cell oxidation improved ONO encroachment between oxide layer and polysilicon layer interface.

It is another object of this invention by using oxygen free radical process cell re-oxidation to eliminate poly stringer.

It is another object of this invention by using oxygen free radical process cell oxidation increased operation efficiency of flash memory.

It is another object of this invention by using oxygen free radical process cell oxidation modified defects after etching process.

It is another object of this invention by utilizing a low thermal budget process for performing a cell re-oxidation, and thus, the short channel effect in a semiconductor structure can be reduced.

In this invention, the method for improving the performance of flash memory. First, a substrate is proved. A tunnel oxide layer is formed on the substrate. There two gate structure are formed on the tunnel oxide layer. The gate structure comprising a first polysilicon layer as a floating gate, an interpoly dielectric layer such as ONO layer on the floating gate, a second polysilicon layer as a control gate on the interpoly dielectric layer. Moreover, the poly stringer is exit between the gates, wherein the poly stringer is unmovied after etched. Next, the oxygen free radical process cell oxidation is processed. In this invention by using activity of oxygen free radical interaction with cell surface quickly in the low pressure. The results ONO encroachment is very slightly then improvement of 6% GCR with oxygen free radical process cell oxidation can increase operation speed by more than 5 times and eliminated poly stringer.

DESCRIPTION OF THE PREFERRED EMBODIMENT

Figure 1:
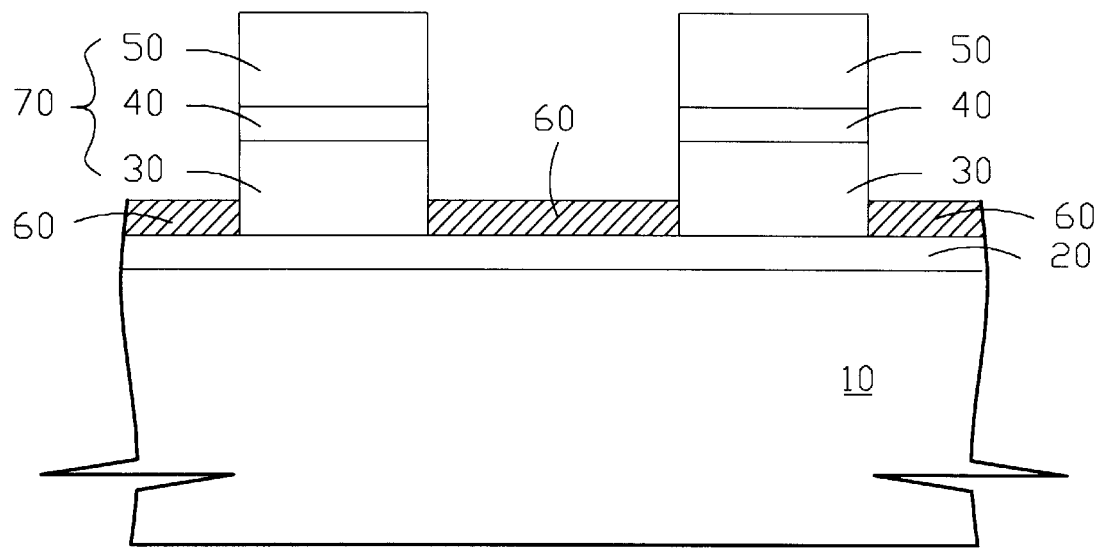
FIG. 1 is a cross-sectional view of the prior art flash memory devices.
Figure 2:
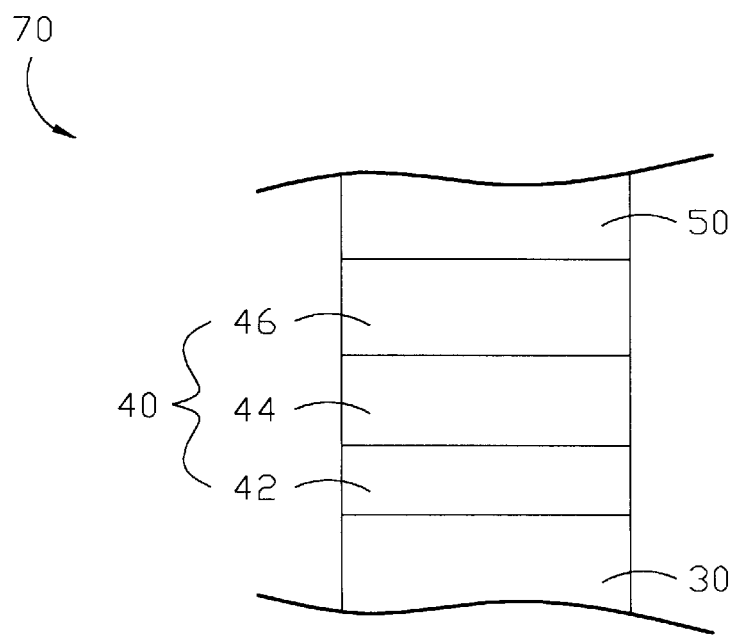
FIG. 2 is an enlarge cross-sectional view of the prior art gate structure comprising floating gate, ONO (oxide-nitride-oxide) layer, control gate.
Figure 3:
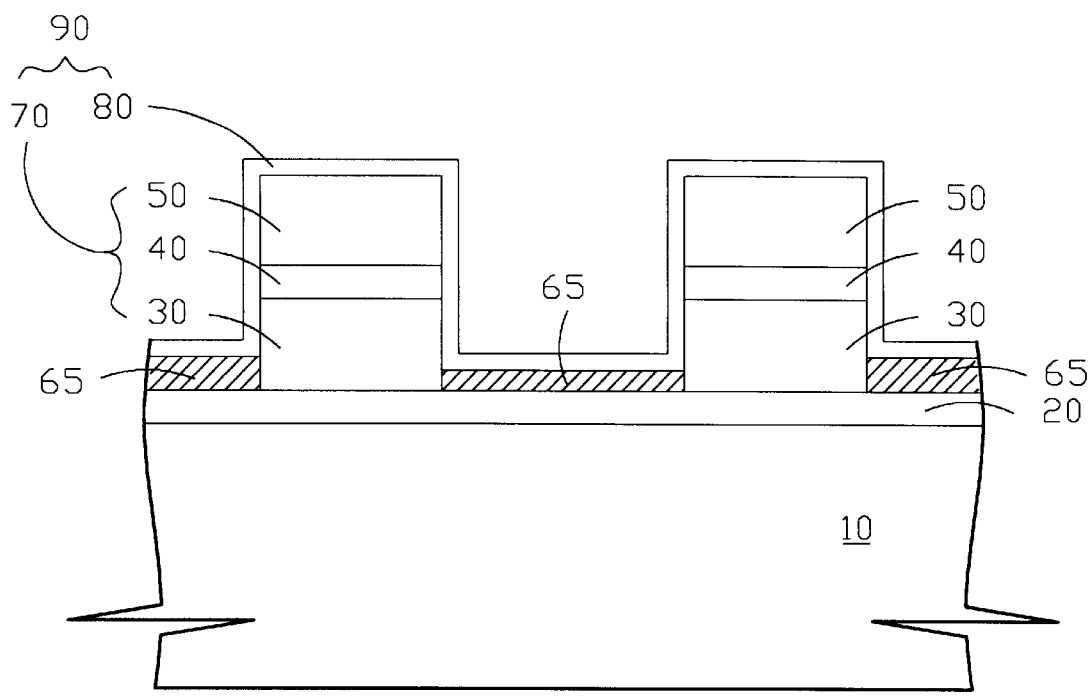
FIG. 3 is cross-sectional view of the prior art flash memory cell oxidation by conventional method to formed poly stringer.
Figure 4:
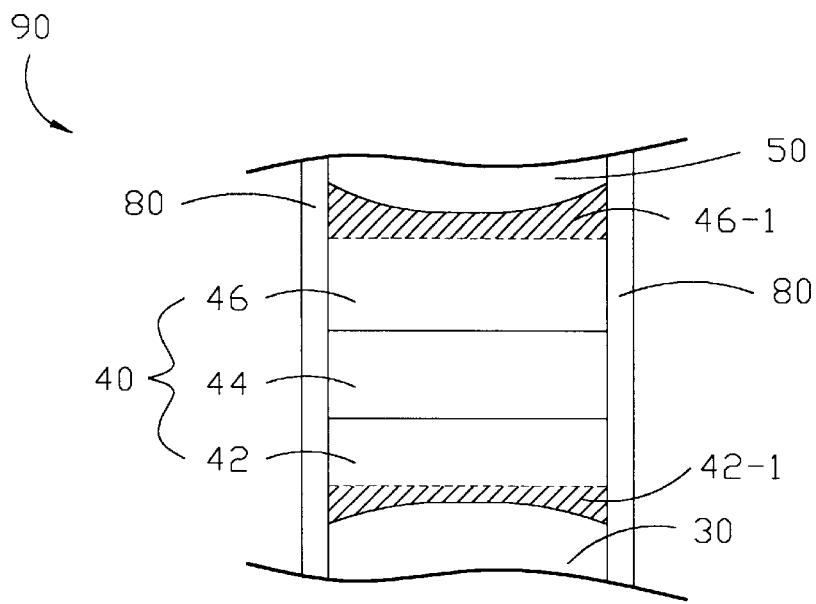
FIG. 4 is an enlarge cross-sectional view of the prior art gate structure by conventional method cell oxidation wherein serious ONO encroachment issue between ONO layer and polysilicon layers.

The present invention will now be described with reference to the drawings, wherein like reference numerals are used to refer to like elements throughout.

Figure 5:
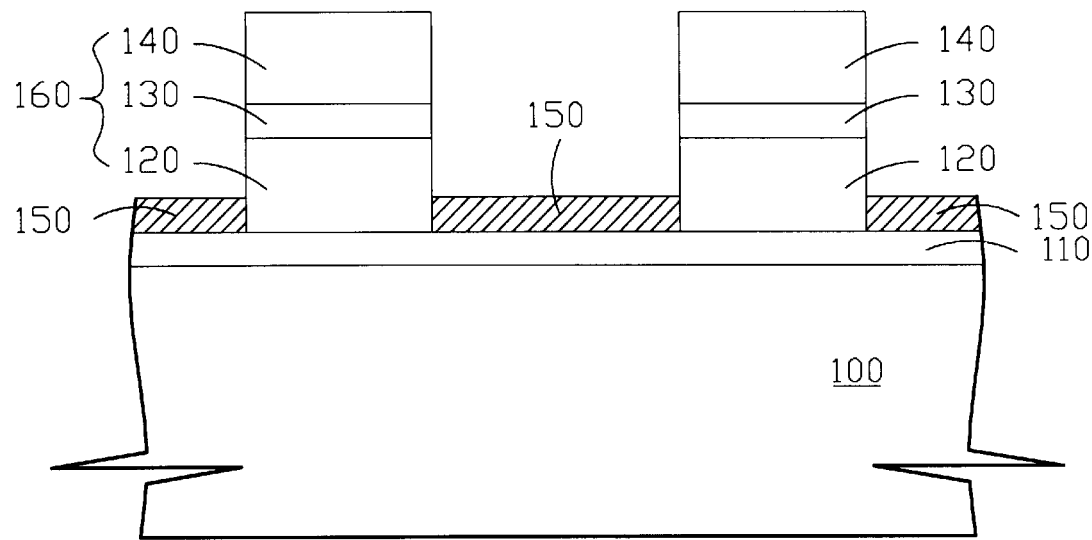
FIG. 5 is a cross-sectional view of the invention flash memory devices.

As shown in FIG. 5 represents the invention of a typical flash memory cell. The memory cell typically includes a substrate 100 and a thin gate dielectric layer 110 (commonly referred to as the tunnel oxide) formed on the surface of the substrate 100, two stacked gate structure 160 overlying the gate dielectric layer 110. The stacked gate 160 also includes a first polysilicon layer as a floating gate 120 which overlies the tunnel oxide 110 and an interpoly dielectric layer 130 which overlies the floating gate 120. Lastly, a second polysilicon layer as a control gate 140 overlies the interpoly dielectric layer 130.

As shown in FIG. 5, the staked gate structure 160 is substantially etched away using conventional etching techniques. However, a problem often occurs at this step involving formation of poly strings 150. Poly stringers 150 result from incomplete removal of polysilicon layer 120 from the unmasked portions of the wafer during etch. These remaining portions of polysilicon layer 120 material are known as polysilicon layer stringers 150 as shown in FIG. 5, which may result in electrically shorting adjacent memory cells. In the other words, the polysilicon layer 120 etching step serves in part to isolate one memory cell from another. However, if a portion of the polysilicon layer 120 is not etched away an forms a conductive path (e.g., poly stringer 150) from one memory cell to another, the memory cells will become electrically shorted.

Figure 6:
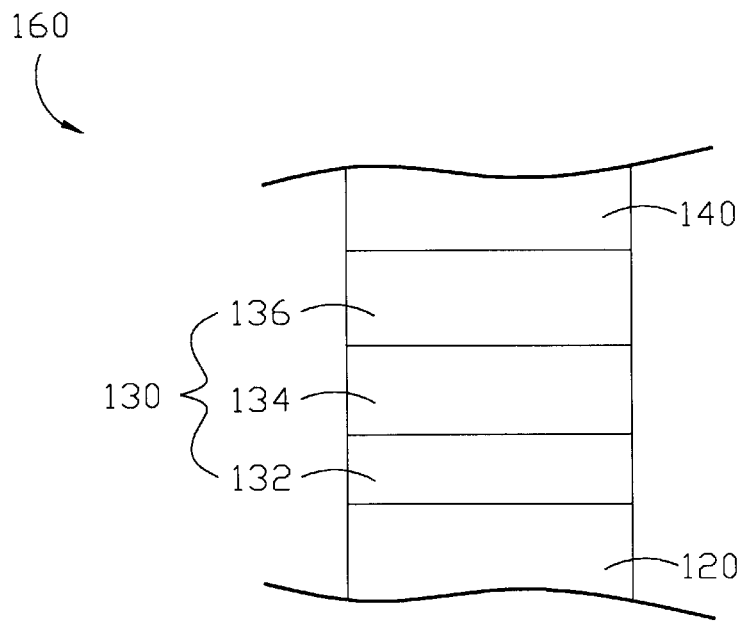
FIG. 6 is an enlarge cross-sectional view of the invention gate structure comprising floating gate, ONO (oxide-nitride-oxide) layer, control gate.

As shown in FIG. 6, the interpoly dielectric layer 130 has a number of important functions including insulating the control gate 140 from the floating gate 120. Accordingly, it is desirable to form a high quality interpoly dielectric layer 130. The interpoly dielectric layer 130 is often a multilayer insulator such as an oxide-nitride-oxide (ONO) layer 130 having two oxide layers 132 and 136 sandwiching a nitride layer 134. In this embodiment, the preferred of thick of bottom oxide layer 132 is about 43 angstrom and top oxide layer 136 is about 62 angstrom, and the thick of nitride layer 134 is about 59 angstrom.

In order to improve ONO encroachment issue and eliminated poly stringer, a new cell oxidation method is proposed to solving ONO encroachment issue and poly stringer. In this invention, the method of cell oxidation is by using oxygen free radical process. In this invention by using activity of oxygen radical interaction with cell surface quickly in the low pressure. In this embodiment, the method is a low-pressure process wherein pre-mixed gas of hydrogen and oxygen are introduced to the process chamber directly, without precombustion. The gas flow ratio of hydrogen and oxygen is 1:2. The pressure is about 5 torr and about 20 torr. The temperature is about 800° C. and about 1100° C. The reaction between hydrogen and oxygen occurs near to the wafer surface because the hot wafer acts as the ignition source.

In this pre-mixing gas to form oxygen free radical process, the presence of hydrogen during pre-mixing gas process oxidation accelerates the dissociation of molecular oxygen into reactive oxygen atoms. Other method to form oxygen free radical such as ozone by utilizing UV light and oxygen by utilizing krypton laser beam.

Figure 7:
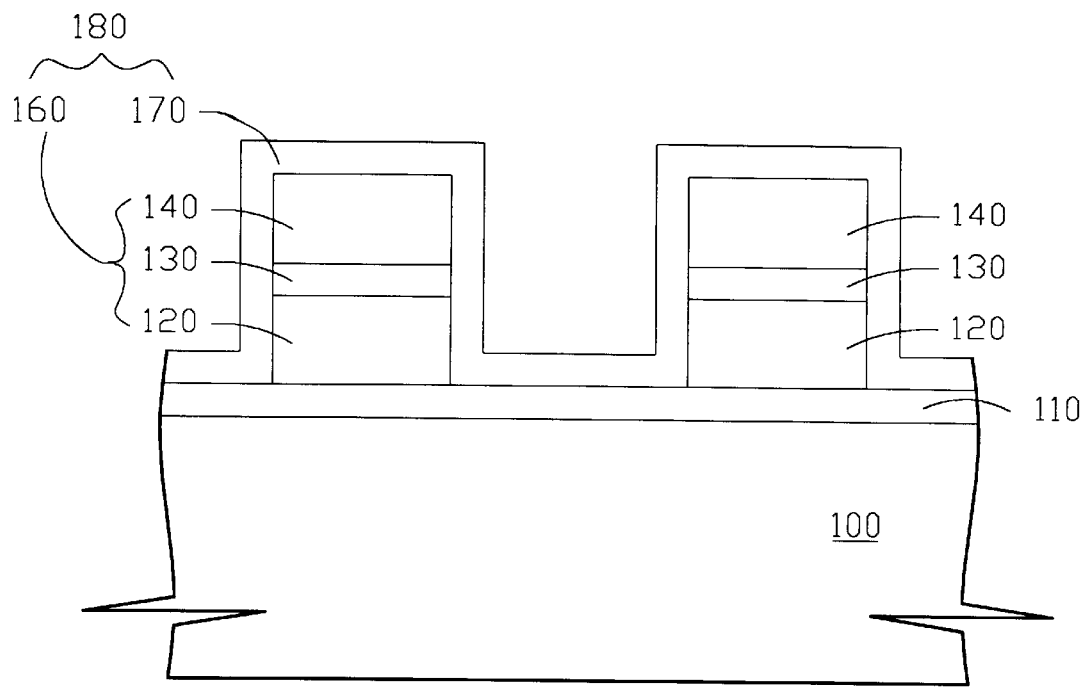
FIG. 7 is cross-sectional view of the invention flash memory cell oxidation by pre-mixing gas process method to eliminate poly stringer.

As shown in FIG. 7, in this embodiment, the cell oxidation by oxygen free radical process, the thick of cell oxide layer 170 is about 200 angstrom. Because the oxide layer 170 is thicker then eliminate poly stringer 150 as shown in FIG. 5. Thus the drawback of prior art which may result in electrically shorting adjacent memory cells is solved.

Figure 8:
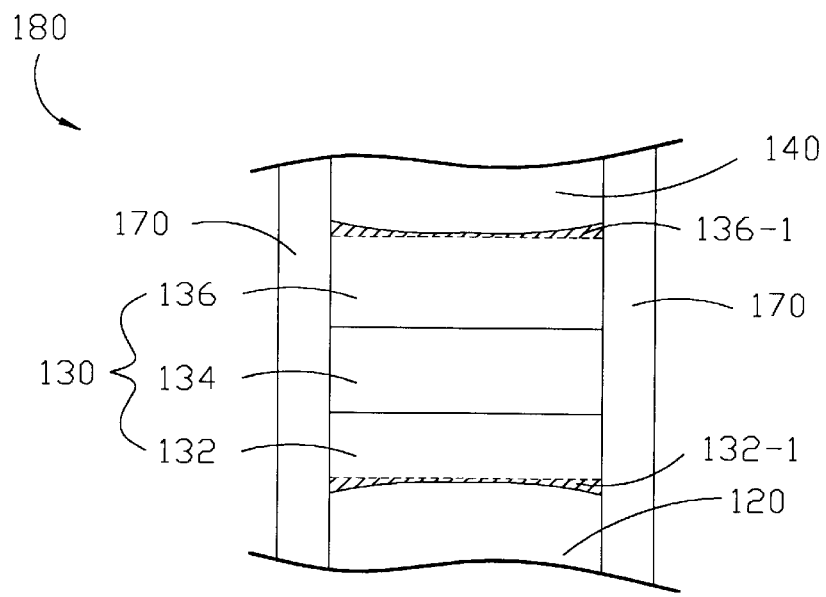
FIG. 8 is an enlarge cross-sectional view of the invention gate structure by pre-mixing gas process method cell oxidation wherein slightly ONO encroachment issue between ONO layer and polysilicon layers.

As shown in FIG. 8, the interpoly dielectric layer 130 comprised oxide layer 132, nitride layer 134 and oxide layer 136. When running oxidation process of the cell by using oxygen free radical process, it is found that ONO encroachment issue 132-1,136-1 is very slight, when cell is oxidization by oxygen free radical process even if the oxide layer 170 is about 200 angstrom. There is nearly no ONO encroachment issue for oxygen free radical process cell oxidation process.

Figure 9:
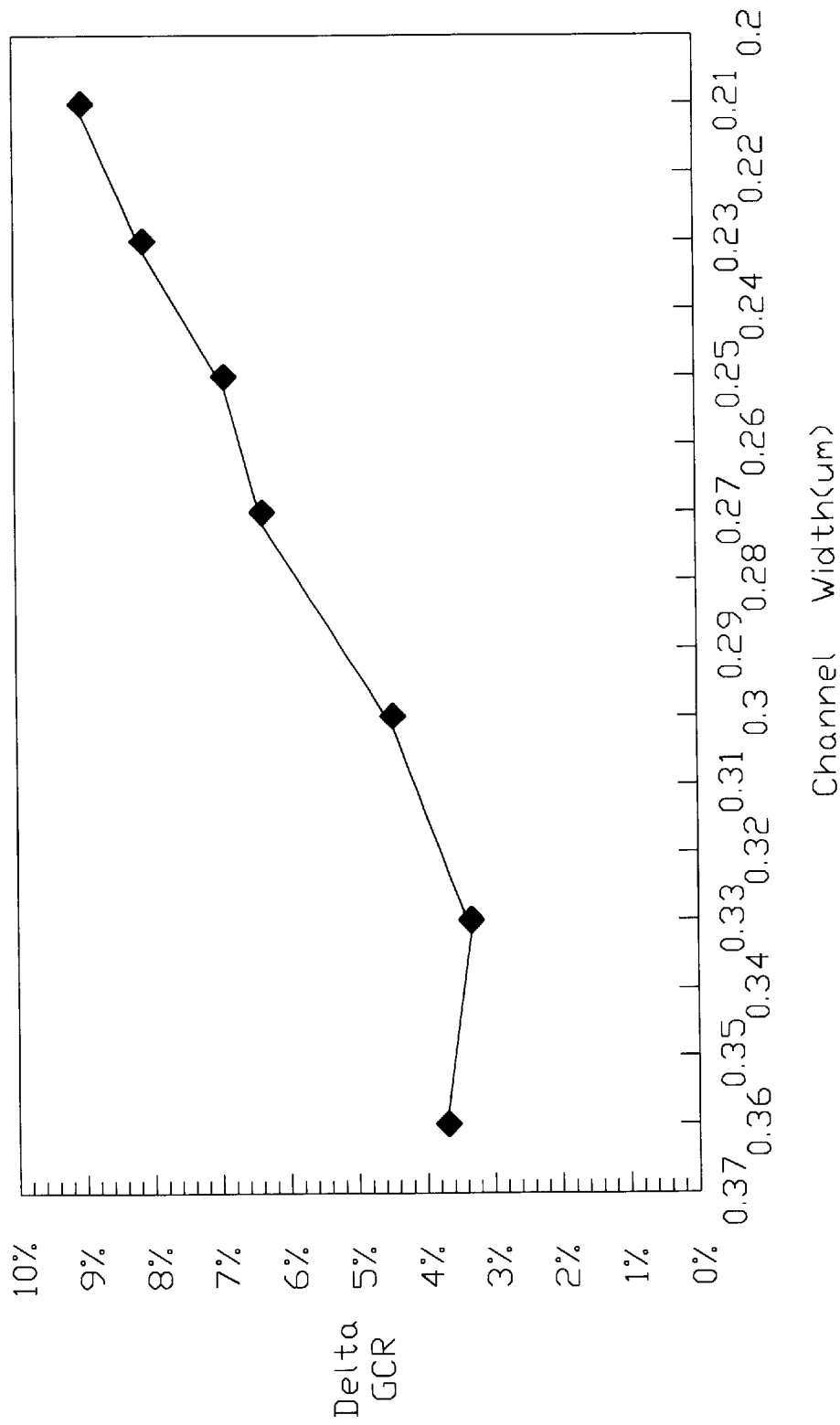
FIG. 9 is shown in when cell dimension scale down, the gate coupling ratio is induced by using oxygen free radical cell oxidation.

As shown in FIG. 9, the abscissa is channel width and vertical coordinates is difference of gate coupling ratio. The difference of gate coupling ratio are cell oxidation by.using oxygen free radical (thick about 200 angstroms) between dry oxidation of prior method (thick about 100 angstroms). When the cell dimension is scale down, the gate coupling ratio is induced by using oxygen free radical process cell oxidation.

From this embodiment results, the cell oxidation by oxygen free radical process has better gate coupling ratio performance than that prior art oxidation such as dry oxidation, wet oxidation and dry RTO method. The gate coupling ratio can be improved about 6% with oxygen free radical process cell oxidation. Higher gate coupling ratio can achieve better FN operation performance. The speed of channel erase with oxygen free radical process cell oxidation is faster than that of prior art condition by nearly 1V. The improvement of above 6% gate coupling ratio with oxygen free radical process cell oxidation can increase operation speed by more than 5 times.

Additionally, in contrast of the prior art, the cell re-oxidation in this embodiment is performed with a low thermal budget process. Therefore, the short channel effect can be reduced by the method disclosed in this embodiment.

While the invention has been particularly shown and described with reference to the preferred embodiments thereof, it will be understood by those skilled in the art that various changes in form and details may be made without departing from the spirit and scope of the invention.

What is claimed is:

1. A method for improving flash memory performance, said method comprising:

providing a substrate having two gate structures thereon, wherein each said gate structure has a gate dielectric layer on said substrate, a first polysilicon layer on said gate dielectric layer, an interpoly dielectric layer on said first polysilicon layer, a second polysilicon layer on said interpoly dielectric layer; and oxidizing said substrate and said two gate structures by using oxygen free radical process.

2. The method of claim 1, wherein said gate dielectric layer comprises silicon oxide.

3. The method of claim 1, wherein said first polysilicon layer serves as a floating gate.

4. The method of claim 1, wherein said interpoly dielectric layer is two oxide layers and sandwiching a nitride layer (oxide-nitride-oxide, ONO).

5. The method of claim 1, wherein said second polysilicon layer serves as a control gate.

6. The method of claim 1, wherein said oxygen free radical is select form pre-mixed gas of hydrogen and oxygen are introduced to the process chamber directly, ozone by using UV light and oxygen by using krypton laser beam.

7. The method of claim 6, wherein ratio of said pre-mixed gas of hydrogen and oxygen is about 1:2.

8. The method of claim 6, wherein the pressure of said pre-mixing gas process is about 5 torr and about 20 torr.

9. The method of claim 6, wherein the temperature of said pre-mixing gas process is about 800° C. and about 1100° C.

10. The method of claim 1, wherein said oxygen free radical process comprises the activity of oxygen radical interaction with cell surface quickly in the chamber.

11. A method for improving the performance of flash memory, said method comprising:

proving a substrate;

forming a gate dielectric layer on said substrate;

forming a first polysilicon layer on said gate dielectric layer;

forming an interpoly dielectric layer on said first polysilicon layer;

forming a second polysilicon layer on said interpoly dielectric layer;

etching said second polysilicon layer, said interpoly dielectric layer, said first polysilicon layer and said gate dielectric layer to form a gate structure; and oxidizing said substrate and said gate structures by using oxygen free radical process, wherein said oxygen free radical process pre-mixed gas of hydrogen and oxygen are introduced to the process chamber directly, without precombustion.

12. The method of claim 11, wherein said gate dielectric layer comprises silicon oxide.

13. The method of claim 11, wherein said first polysilicon layer serves as a floating gate.

14. The method of claim 11, wherein said interpoly dielectric layer is two oxide layers and sandwiching a nitride layer (oxide-nitride-oxide, ONO).

15. The method of claim 11, wherein said second polysilicon layer serves as a control gate.

16. The method of claim 11, wherein ratio of said pre-mixed gas of hydrogen and oxygen is about 1:2.

17. The method of claim 16, wherein the pressure of said pre-mixing gas process is about 5 torr and about 20 torr.

18. The method of claim 16, wherein the temperature of said pre-mixing gas process is about 800° C. and about 1100° C.

19. The method of claim 11, wherein said oxygen free radical process comprises the activity of oxygen radical interaction with cell surface quickly in the chamber.

* * * * *